United States Patent
Liu et al.

(10) Patent No.: US 10,184,172 B2
(45) Date of Patent: Jan. 22, 2019

(54) MAGNETRON SPUTTERING DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Hailong Liu, Beijing (CN); Yujie Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/520,312

(22) PCT Filed: May 20, 2016

(86) PCT No.: PCT/CN2016/082742
§ 371 (c)(1),
(2) Date: Apr. 19, 2017

(87) PCT Pub. No.: WO2017/133139
PCT Pub. Date: Aug. 10, 2017

(65) Prior Publication Data
US 2018/0105929 A1   Apr. 19, 2018

(30) Foreign Application Priority Data

Feb. 1, 2016   (CN) .......................... 2016 1 0069477

(51) Int. Cl.
*C23C 14/50*   (2006.01)
*C23C 14/35*   (2006.01)
*H01J 37/34*   (2006.01)

(52) U.S. Cl.
CPC .............. *C23C 14/50* (2013.01); *C23C 14/35* (2013.01); *H01J 37/3405* (2013.01); *H01J 37/3411* (2013.01)

(58) Field of Classification Search
CPC ...... C23C 14/35; C23C 14/50; H01J 37/3405; H01J 37/3411
(Continued)

(56) References Cited

U.S. PATENT DOCUMENTS

| 6,368,404 B1 | 4/2002 | Gurary et al. |
| 2003/0183611 A1 | 10/2003 | Gregor et al. |

FOREIGN PATENT DOCUMENTS

| CN | 201981253 U | 9/2011 |
| CN | 103540896 A | 1/2014 |

(Continued)

OTHER PUBLICATIONS

Machine Translation of CN105483633 dated Apr. 13, 2016.*
International Search Report and Written Opinion dated Nov. 9, 2016; PCT/CN2016/082742.

*Primary Examiner* — Rodney G McDonald
(74) *Attorney, Agent, or Firm* — Ladas & Parry LLP

(57) ABSTRACT

A magnetron sputtering device is disclosed and includes a magnetic levitation track and a supporter which is levitated on the magnetic levitation track. The supporter includes a magnetic track fixed on the supporter via a plurality of pads; each of the pads includes a first insulation plate and a second insulation plate, the first insulation plate and the magnetic track are connected via a first fastener, the second insulation plate and the supporter are connected via a second fastener, and the second fastener and the first fastener are not in contact with each other; the first insulation plate and the second insulation plate are connected via a third fastener, the third fastener is not in contact with both the magnetic track (Continued)

and the supporter, and the third fastener is not in contact with both the first fastener and the second fastener.

15 Claims, 2 Drawing Sheets

(58) Field of Classification Search
USPC ............ 204/298.23, 298.25, 298.26, 298.15; 118/729; 198/679, 805
See application file for complete search history.

(56) References Cited

FOREIGN PATENT DOCUMENTS

| | | |
|---|---|---|
| CN | 104878363 A | 9/2015 |
| CN | 105483633 A | 4/2016 |
| JP | 63288808 A | 11/1988 |

* cited by examiner

MAGNETRON SPUTTERING DEVICE

TECHNICAL FIELD

Embodiments of the present invention relates to the field of vacuum film coating, more specifically, to a magnetron sputtering device.

BACKGROUND

Currently, the vacuum magnetron sputtering technology is extensively used in the film coating field. The magnetron sputtering device in the prior art is provided with a magnetic levitation track, on which the supporter for supporting the object to be processed is levitated. While the object on the supporter is being coated, the insulation pad disposed on the periphery of the supporter may be coated with metal film on its surface, which would result in abnormal discharge between the magnetic track and the supporter and seriously impact the quality of the coated film.

SUMMARY

Embodiments of the present invention provides a magnetron sputtering device, comprises: a magnetic levitation track; and a supporter which is levitated on the magnetic levitation track and comprises a magnetic track fixed on the supporter via a plurality of pads; wherein each of the pads comprises a first insulation plate and a second insulation plate sequentially arranged between the magnetic track and the supporter, the first insulation plate and the magnetic track are connected with each other via a first fastener, the second insulation plate and the supporter are connected with each other via a second fastener, and the second fastener and the first fastener are not in contact with each other; the first insulation plate and the second insulation plate are connected with each other via a third fastener, neither the magnetic track nor the supporter is in contact with the third fastener, and neither the first fastener nor the second fastener is in contact with the third fastener.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
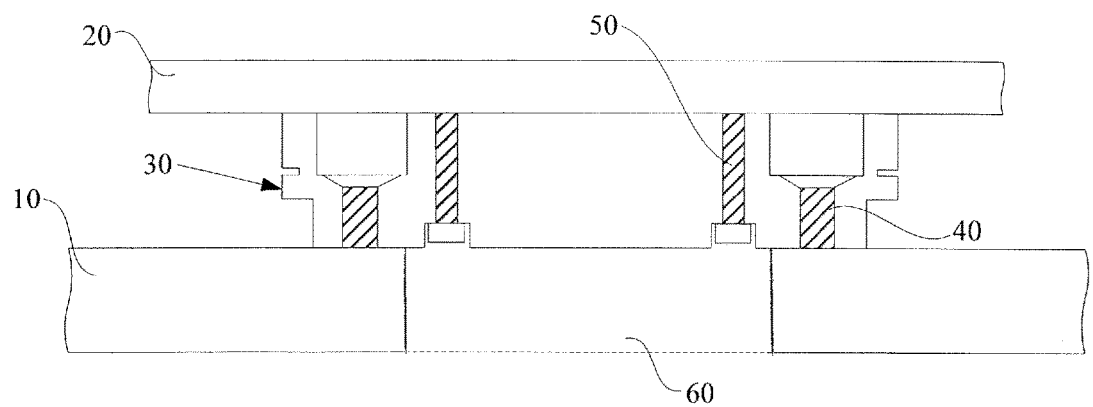
FIG. 1 schematically illustrates a pad in a magnetron sputtering device.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure FIG. 1 schematically illustrates an insulation pad for fixing a magnetic track on a supporter. The magnetron sputtering device is provided with a magnetic levitation track that makes the supporter 10 levitated and moving. The supporter 10 is a metal plate that is typically made of aluminum and configured for supporting an object to be processed. A magnetic track 20 is disposed on the periphery of the supporter 10 and configured for generating magnetic levitation force between the magnetic levitation track and the magnetic track 20. The magnetic track 20 is connected to the chamber of the magnetron sputtering device and fixed on the supporter 10 via an insulation pad 30.

As illustrated in FIG. 1, the insulation pad 30 is connected to the supporter 10 via an interior screw 40 firstly and then connected to the magnetic track 20 via a screw 50, such that the magnetic track 20 is fixed on the supporter 10. In the case that the metal film deposited on the surface of the insulation pad 30 in the opening 60 of the supporter 10 has a certain thickness, it may electrically connect the screw 50 to the supporter 10, and in turns electrically connect both the magnetic track and the chamber to the supporter.

Figure 2:
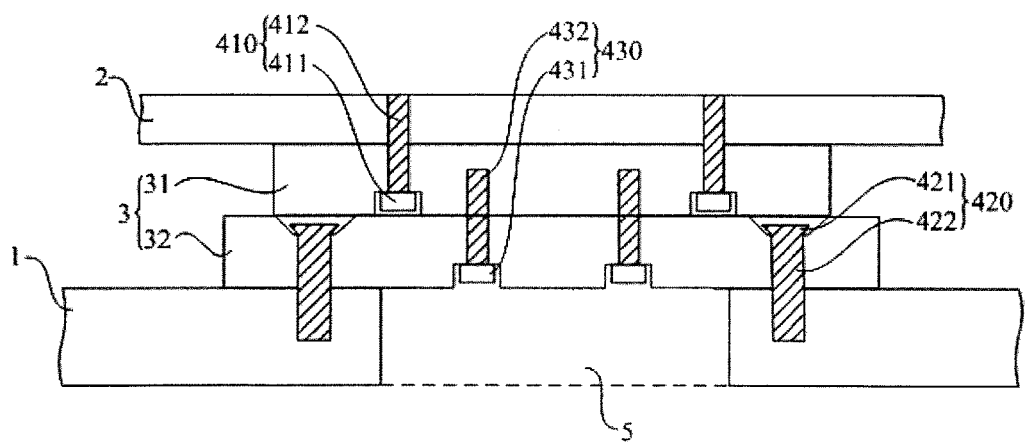
FIG. 2 schematically illustrates a pad in a magnetron sputtering device provided in an embodiment of the present invention.
Figure 3:
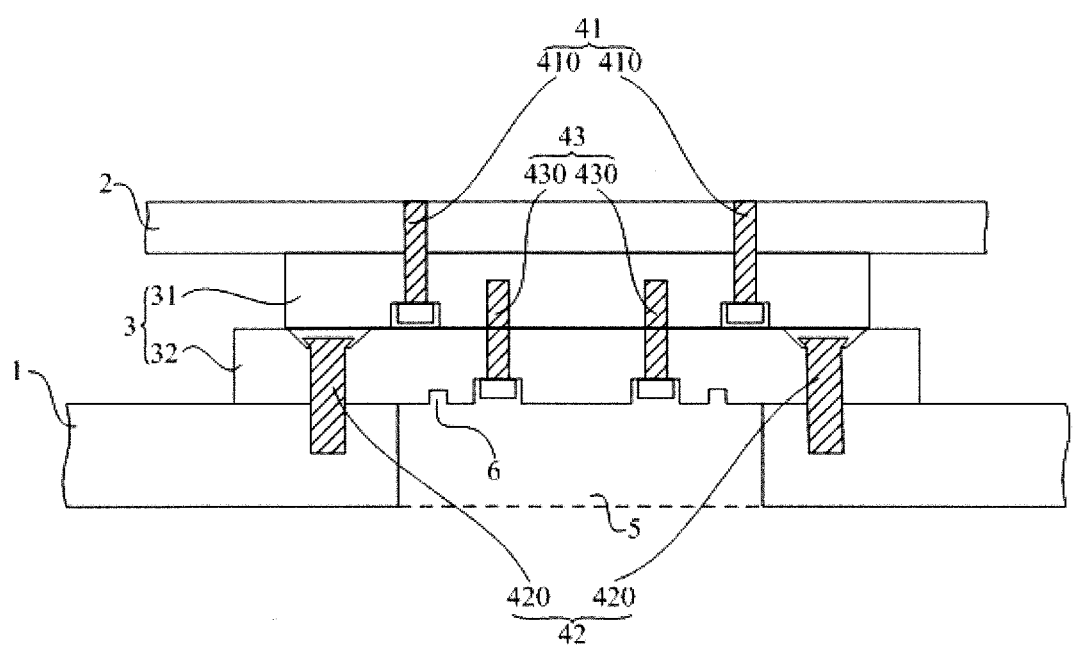
FIG. 3 schematically illustrates a pad in a magnetron sputtering device provided in another embodiment of the present invention.

As illustrated in FIG. 2 and FIG. 3, an embodiment of the present invention provides a magnetron sputtering device comprising: a magnetic levitation track; and a supporter 1 fixed on the magnetic levitation track. The supporter 1 is levitated and movable along the extending direction of the magnetic levitation track and provided with a magnetic track 2 configured for generating magnetic levitation force between the magnetic levitation track and itself. The magnetic track 2 is fixed on the supporter 1 via a plurality of pads 3.

Each pad 3 comprises a first insulation plate 31 and a second insulation plate 32, both of which are positioned between the magnetic track 2 and the supporter 1. The second insulation plate 32 is positioned between the first insulation plate 31 and the supporter 1. The first insulation plate 31 is fixedly connected with the magnetic track 2 via a first fastener 41 therebetween; the second insulation plate 32 is fixedly connected with the supporter 1 via a second fastener 42 therebetween; and the second fastener 42 is not in contact with the first fastener 41. The first insulation plate 31 is fixedly connected with the second insulation plate 32 via a third fastener 43 therebetween. Neither of the magnetic track 2 and the supporter 1 is in contact with the third fastener 43, and neither of the first fastener 41 and the second fastener 42 is in contact with the third fastener 43.

In the magnetron sputtering device described above, each pad 3 comprises two portions that are fixedly connected with each other, i.e., the first insulation plate 31 and the second insulation plate 32. In each pad 3, the first insulation plate 31 is adjacent to the magnetic track 2 and the second insulation plate 32 is adjacent to the supporter 1, thereby implementing fixed connection between the magnetic track 2 and the supporter 1. In the magnetron sputtering device, the first fastener 41 for connecting the magnetic track 2 with the first insulation plate 31 is separated from the supporter 1 by the second insulation plate 32; the second fastener 42 connecting the supporter 1 with the second insulation plate 32 is separated from the magnetic track 2 by the first insulation plate 31. Therefore, even if a metal film is formed on the surface of the pad 3, the magnetic track 2 and the supporter 1 would not be electrically connected with each other through the metal film or any of the first fastener 41 and the second fastener 42. The metal film on the surface of the pad 3 would not electrically connect the magnetic track 2 with the supporter 1 through the first fastener 41 and the second fastener 42, since the first fastener 41 and the second fastener 42 are not in contact with each other. In addition, it is difficult for the metal film formed on the surface of the pad 3 to electrically connect the magnetic track 2 with the supporter 1 through the third fastener 43 or all of the three fasteners described above, since the third fastener 43 for connecting the first insulation plate 31 with the second insulation plate 32 is not in contact with any of the magnetic track 2 and the supporter 1 and not in contact with any of the first fastener 41 and the second fastener 42. In conclusion, in the magnetron sputtering device described above, the fasteners (including the first fastener 41, the second fastener 42 and the third fastener 43) in the pad 3 is impossible to electrically connect the magnetic track 2 with the supporter 1, so abnormal discharge is not apt to occur in the above magnetron sputtering device during operating process.

The first insulation plate 31 is fixedly connected with the magnetic track 2 via the first fastener 41 in the following way: the first insulation plate 31 is provided with at least one first via; the magnetic track 2 is provided with at least one first threaded hole in one-to-one correspondence with the first via; the first fastener 41 comprises at least one first screw 410 that passes through the first via and matches the thread of the first threaded hole corresponding to the first via. As an example, the first screw 410 comprises a screw cap 411 and a screw rod 412; the first via comprises a first portion for accommodating the screw cap 411 of the first screw 410 and a second portion for the screw rod 412 of the first screw 410 to pass through. For example, the depth of the first portion is greater than the thickness of the screw cap of the first screw 410. In this way, when the first screw 410 is tightened, the screw cap 411 would be deeply located in the interior of the first via, such that the first screw 410 and the second insulation plate 32 are not in contact with each other. Therefore, the first screw 410 and the second screw 420 could be prevented from being in contact with each other, thereby avoiding the electrical connection between the magnetic track 2 and the supporter 1 caused by the first screw 410 and the second screw 420.

The second insulation plate 32 is fixedly connected with the supporter 1 via the second fastener 42 in the following way: the second insulation plate 32 is provided with at least one second via; the supporter 1 is provided with at least one second threaded hole in one-to-one correspondence with the second via; the second fastener 42 comprises at least one second screw 420 that passes through the second via and matches the thread of the second threaded hole corresponding to the second via. As an example, the second screw 420 comprises a screw cap 421 and a screw rod 422. The second via comprises a first portion for accommodating the screw cap 421 of the second screw 420 and a second portion for the screw rod 422 of the second screw 420 to pass through. For example, the depth of the first portion is greater than the thickness of the screw cap of the second screw 420. In this way, when the second screw 420 is tightened, the screw cap 421 of the second screw 420 would be deeply located in the interior of the second via, such that the second screw 420 and the first insulation plate 31 are not in contact with each other. Therefore, the first screw 410 and the second screw 420 could be further prevented from being in contact with each other, thereby avoiding the electrical connection between the magnetic track 2 and the supporter 1 caused by the first screw 410 and the second screw 420.

In at least some of the embodiments, as illustrated in FIG. 2 and FIG. 3, the first via of the first insulation plate 31 and the second via of the second insulation plate 32 are not in communication with each other. That is, the locations of the first via and the second via are separated from each other and have no overlapping region. This configuration can completely prevent the first screw 410 from being in contact with the second screw 420, and avoid the electrical connection between the magnetic track 2 and the supporter 1 caused by the first screw 410 and the second screw 420.

The first insulation plate 31 is fixedly connected to the second insulation plate 32 via the third fastener 43 in the following way: the second insulation plate 32 is provided with at least one third via; the first insulation plate 31 is provided with at least one of the third threaded hole in one-to-one correspondence with the third via, and each of the third threaded holes is a blind hole; the third fastener 43 comprises at least one third screw 430 that passes through the third via and matches the thread of the third threaded hole. As an example, the third screw 430 comprises a screw cap 431 and a screw rod 432. The third via comprises a first portion for accommodating the screw cap 431 of the third screw 430 and a second portion for the screw rod 432 of the third screw 430 to pass through. For example, the depth of the first portion is greater than the thickness of the screw cap of the third screw 430. In this way, when the third screw 430 is tightened, the screw cap 431 of the third screw 430 would be deeply located in the interior of the second via, such that the third screw 430 and the first insulation plate 1 are not in contact with each other, thereby avoiding the electrical connection between the magnetic track 2 and the supporter 1 caused by the third screw 430.

In at least some of the embodiments, the third via of the second insulation plate 32 and the first via of the first insulation plate 31 are not in communication with each other. That is, the location of the third via and the third threaded hole and the location of the first via are separated from each other and have no overlapping region. This configuration can completely prevent the third screw 430 from being in contact with the first screw 410, and can avoid the electrical connection between the magnetic track 2 and the supporter 1 caused by the third screw 430 and the first screw 410.

In at least some of the embodiments, the third fastener 43 comprises two third screws 430, the first insulation plate 31 and the second insulation plate 32 are connected with each other by the two third screws 430. In the case that the third fastener 32 comprises only one third screw 430, the connection between the first insulation plate 31 and the second insulation plate 32 is unstable and thus relative rotational motion is likely to occur between them. However, if the third fastener 43 comprises too many third screws 430, the possibility of forming electrically connection between the magnetic track 2 and the supporter 1 may be increased. So the third fastener 43 comprises two third screws 430, such that the connection between the first insulation plate 31 and the second insulation plate 32 is reliable and the electrical connection between the magnetic track 2 and the supporter 1 can be avoided to maximum extent.

Similarly, in another embodiment, the first fastener 41 comprises two first screw 410; the second fastener 42 comprises two second screw 420.

Obviously, in the magnetron sputtering device of the present invention, the first fastener 41, the second fastener 42 and the third fastener 43 configured for connecting the pad, the magnetic track and the supporter is not limited to the forms disclosed in the above embodiments, i.e., the fastener described above is not limited to threaded fastener. In at least some of the embodiments, any one of the first fastener 41, the second fastener and the third fastener 43 comprises a structural element in line with its function.

In at least some of the embodiments, the supporter 1 is provided with a fixing-operation opening 5 for the convenience of fixing the third fastener 43 (i.e., at least one third screw 430), and the third vias on the second insulation plate 32 are all located in the area of the fixing-operation opening 5. In this way, the process of fixing the magnetic track 2 on the supporter 1 via the pad 3 may comprise steps of: first, connecting the first insulation plate 31 of the pad 3 with the magnetic track 2 and connecting the second insulation plate 32 of pad 3 with the supporter 1 respectively, and then connecting the first insulation plate 31 with the second insulation plate 32. Specifically, the staff could fix the first fastener 43 through the above fixing-operation opening 5 and thus further fixedly connect the first insulation plate 31 with the second insulation plate 32.

As illustrated in FIG. 3, in at least some of the embodiments, the surface of the the second insulation plate 32 that faces the supporter 1 (i.e., on the side close to the supporter 1) is provided with an insulation groove 6, and the insulation groove 6 is located within the fixing-operation opening 5.

In the above embodiment, the second insulation plate 32 is provided with an insulation groove 6 located within the fixing-operation opening 5, such that the metal film formed on the second insulation plate 32 within the fixing-operation opening 5 could be cut off by the insulation groove 6. Since the metal film which is cut off is impossible to electrically connect the third screw 430 with the supporter 1, the supporter 1 and the magnetic track 2 is impossible to be connected with each other through the third threw 430. Therefore, the above insulation groove 6 can avoid the electrical connection between the third screw 430 and the supporter 1, and further prevent the third fastener 43 from electrically connecting the magnetic track 2 and the supporter 1.

In at least some of the embodiments, the above insulation groove 6 is an annular groove that encloses each of the third vias, i.e., an annular groove that encloses all the third screws 430. The above annular insulation groove 6 can separate the third screw 430 from the periphery of the fixing-operation opening 5 on the supporter 1, so the metal film formed in the fixing-operation opening 5 is cut into an interior portion that is inside the annular insulation groove 6 and an external portion that is outside the annular insulation groove 6 by the annular insulation groove 6. Thus, the metal film doesn't connect the third screw 430 that is located inside the annular insulation groove 6 with the periphery of the fixing-operation opening 5 that is outside the annular insulation groove 6. That is, the metal film formed within the fixing-operation opening 5 doesn't electrically connect the third screw 430 with the supporter 1. Therefore, the above insulation groove 6 can effectively prevent the third fastener 43 from electrically connecting the magnetic track 2 with the supporter 1.

In at least some of the embodiments, the first insulation plate 31 and the second insulation plate 32 of the pad 3 are made of resin material. Obviously, the material of the first insulation plate 31 and the second insulation plate 32 is not limited to resin. Instead, any suitable solid insulation material may be adopted according to actual requirement.

What is described above is related to the illustrative embodiments of the disclosure only and not limitative to the scope of the disclosure; the scopes of the disclosure are defined by the accompanying claims.

The present application claims the priority of Chinese patent application No. 201610069477.4 filed on Feb. 1, 2016, the disclosure of which is incorporated herein by reference in its entirety.

The invention claimed is:

1. A magnetron sputtering device, comprises: a magnetic levitation track; and a supporter which is levitated on the magnetic levitation track and comprises a magnetic track fixed on the supporter via a plurality of pads;
   wherein each of the pads comprises a first insulation plate and a second insulation plate sequentially arranged between the magnetic track and the supporter, the first insulation plate and the magnetic track are connected with each other via a first fastener, the second insulation plate and the supporter are connected with each other via a second fastener, and the second fastener and the first fastener are not in contact with each other; the first insulation plate and the second insulation plate are connected with each other via a third fastener, neither the magnetic track nor the supporter is in contact with the third fastener, and neither the first fastener nor the second fastener is in contact with the third fastener.

2. The magnetron sputtering device of claim 1, wherein the first insulation plate is provided with at least one first via; the magnetic track is provided with at least one first threaded hole; the first fastener comprises at least one first screw that passes through the first via and matches thread of the first threaded hole.

3. The magnetron sputtering device of claim 2, wherein the second insulation plate is provided with at least one second via; the supporter is provided with at least one second threaded hole; the second fastener comprises at least one second screw that passes through the second via and matches thread of the second threaded hole.

4. The magnetron sputtering device of claim 3, wherein the first via of the first insulation plate is not in communication with the second via of the second insulation plate.

5. The magnetron sputtering device of claim 1, wherein the second insulation plate is provided with at least one third via; the first insulation plate is provided with at least one third threaded hole, and each third threaded hole is a blind hole; the third fastener comprises at least one third screw that passes through the third via and matches the third threaded hole.

6. The magnetron sputtering device of claim 5, wherein the third via of the second insulation plate is not in communication with the first via of the first insulation plate.

7. The magnetron sputtering device of claim 5, wherein the third fastener comprises two third screws.

8. The magnetron sputtering device of claim 5, wherein the supporter is provided with an opening which is configured for fixing operation of the third fastener, and the at least one third via on the second insulation plate is located within the opening.

9. The magnetron sputtering device of claim 8, wherein a surface of the second insulation plate that faces the supporter is provided with an insulation groove, and the insulation groove is located within the opening.

10. The magnetron sputtering device of claim 9, wherein the insulation groove is an annular groove that encloses the third via.

11. The magnetron sputtering device of claim 1, wherein the first insulation plate is made of resin material.

12. The magnetron sputtering device of claim 1, wherein the second insulation plate is made of resin material.

13. The magnetron sputtering device of claim 2, wherein the second insulation plate is provided with at least one third via; the first insulation plate is provided with at least one third threaded hole, and each third threaded hole is a blind hole; the third fastener comprises at least one third screw that passes through the third via and matches the third threaded hole.

14. The magnetron sputtering device of claim 3, wherein the second insulation plate is provided with at least one third via; the first insulation plate is provided with at least one third threaded hole, and each third threaded hole is a blind hole; the third fastener comprises at least one third screw that passes through the third via and matches the third threaded hole.

15. The magnetron sputtering device of claim 4, wherein the second insulation plate is provided with at least one third via; the first insulation plate is provided with at least one third threaded hole, and each third threaded hole is a blind hole; the third fastener comprises at least one third screw that passes through the third via and matches the third threaded hole.

* * * * *